United States Patent [19]
McCorkle

[11] Patent Number: 5,821,817
[45] Date of Patent: Oct. 13, 1998

[54] FAST-LOCKING LOW-NOISE PHASE-LOCKED LOOP

[75] Inventor: John W. McCorkle, Laurel, Md.

[73] Assignee: The United States of America as represented by the Secretary of the Army, Washington, D.C.

[21] Appl. No.: 876,660

[22] Filed: Jun. 16, 1997

[51] Int. Cl.[6] .................................................. H03L 7/08
[52] U.S. Cl. ...................... 331/1 A; 331/17; 331/DIG. 2; 327/159; 327/160
[58] Field of Search ................................ 331/16, 17, 1 A, 331/25, DIG. 2; 327/156, 159, 160; 375/376

[56] References Cited

U.S. PATENT DOCUMENTS 3,983,498  9/1976  Malek .................................... 331/25 X
4,827,225  5/1989  Lee ............................................ 331/10

*Primary Examiner*—Steven Mottola
*Assistant Examiner*—Arnold Kinkead
*Attorney, Agent, or Firm*—Paul Clohan

[57] ABSTRACT

A phase-locked-loop device for generating an output signal of frequency Fo, in phase-lock with an input signal of frequency Fi, where Fo=N(Fi/M). The invention reduces noise and provides optimal-time frequency switching—settling in one cycle of the phase-detector reference signal by applying a signal shaped like a smooth broad hump to the voltage-controlled oscillator upon a frequency change command. It maintains optimal-time switching by keeping the PLL loop-gain constant. The invention reduces noise by eliminating the so called "dead-zone" in the digital phase-detector.

12 Claims, 5 Drawing Sheets

FAST-LOCKING LOW-NOISE PHASE-LOCKED LOOP

TECHNICAL FIELD OF THE INVENTION

The present invention pertains to a phase-locked loop (PLL) circuit particularly, to a fast-locking low-noise PLL circuit, and more particularly to a fast switching low noise programmable synthesizer.

BACKGROUND OF THE INVENTION

Phase-locked loop circuits are well known in the art. These circuits are used to detect a signal and produce a phase-locked, and filtered, version of the input signal. As described in ELECTRONICS ENGINEERS' HANDBOOK as edited by Fink and Christiansen, the phase-locked loop, is a fundamental circuit block in communication systems. It is a frequency-selective circuit typically comprised of a phase comparator, a low-pass filter, an amplifier, and a voltage-controlled oscillator (VCO). A divide-by-N circuit is often used in a phase-locked loop circuit between the VCO and the phase detector to allow frequency multiplication by N. Phase-locked loops have been used to demodulate, recondition, and synchronize signals. A classic example of synchronizing and frequency multiplication is a programmable frequency synthesizer where the output signal frequency is programmable in steps of f, yet is always synchronized to a reference frequency which is typically derived from a high stability crystal oscillator.

The phase comparator produces an average output voltage proportional to the phase difference between the signals on its two inputs—one derived from the VCO's output signal (possibly after passing through a divide-by-N) and the other being the reference signal. The phase-voltage from the phase detector is filtered by the low-pass filter, amplified by the amplifier, and used as the control voltage of the voltage-controlled oscillator, which forms a feedback-loop. If the VCO attempts to drift, or if the reference frequency changes, the phase-voltage modulates the VCO to cause its output signal to keep the two phase-detector input signals identical in frequency and with a fixed phase relationship. While this result is achieved, the two signals are said to be in phase-lock.

Phase-locked loops have been constructed using analog and digital phase detectors. Each has its advantages and disadvantages. A typical analog phase detector is constructed from a multiplier followed by a low-pass filter. This type of phase detector is referred to as a mixer-type phase detector and phase lock occurs when the reference signal and voltage controlled oscillator or VCO output signal are at a 90 degrees phase relationship. Mixer-type phase detectors suffer from four major problems (i.e., (1) the polarity of the desired output of the mixer is not correct over the entire 360 degree range, but reverses every 180 degrees causing a deleterious sign-reversal in the feedback, (2) a signal at twice the reference signal appears at the output, which causes spurious tones in the VCO output signal, (3) the mixer output does not indicate whether the frequency of the voltage-controlled oscillator is above or below the frequency of the reference signal which results in poor start-up performance, and (4) a false output signal occurs when the reference signal and the output of the voltage-controlled oscillator are odd harmonics of each other which can cause the phase-locked loop to lock onto an undesired frequency).

One technique used to combat these problems is to use a digital phase detector. Digital phase detectors can be integrated with other digital circuits to produce powerful, reliable, and compact systems. But there are problems associated with digital phase detectors.

The details of digital phase detectors are generally known. Motorola's MC4044 is a transistor-transistor-logic (TTL) version of a digital phase detector. The former Radio Corporation of America (RCA), which is now owned by General Electric Corporation, manufactures part number CD4046 which is a CMOS version of a digital phase detector. Phase lock with these detectors occur when the reference and the VCO output signals are at a 0 degree phase relationship. Not only do they provide correct output over the full $+\pi$ to $-\pi$ radian phase range, they also correctly control the VCO when its frequency is too low or too high.

Since CMOS is the technology of choice for integrating signal processing functions with combinatory logic, and since its operation is similar to that of many phase detectors implemented with combinatorial logic, the description will focus on the operation of the CD4046. A first output of the CD4046, designated the phase detector output, has three states (i.e., high, low, and open-circuit). The phase signal is encoded by the duty cycle and sign of the output. A second output of the CD4046, designated the LOCK output, is high whenever the first output is open-circuited, and is low otherwise.

Unfortunately, there remain problems with digital phase detectors. There is a nonlinearity in the output of the digital phase detector, i.e., a so-called dead-zone around the zero phase point, as shown in FIG. 5. In a closed loop system, this nonlinearity causes the phase of the voltage-controlled oscillator to drift randomly around the zero phase point. This random drifting causes spreading of the spectrum in the frequency domain and can cause time sensitive systems to malfunction due to random variations in the time between zero crossings.

The nonlinearity is caused by unequal delay paths within the phase detector logic circuitry as well as the finite switching speed of the devices used in the digital phase detector. When the phase difference between the phase detector inputs is insufficient to allow the output transistors to change state, then the phase detector simply fails to produce an output. When this condition exists, the first output of the digital phase detector remains in an open-circuit state instead of switching to either a high state or a low state. The net effect is a dead-zone centered at the zero phase point. The width of the dead-zone is a function of the speed of the devices and delay matching in the digital phase detector. As the devices in the digital phase detector are made faster, the dead-zone becomes narrower. However, the dead-zone can never be eliminated by merely using faster transistors. In frequency synthesizer applications, this dead zone results in noise caused by the phase of the output signal randomly bouncing around in this dead zone.

Another problem with digital phase detectors is that a narrow spike is generated as an output signal. This spike causes high peak control signals to be generated. The spike also causes frequency components to be generated at many harmonics of the reference signal. This spike is a serious problem for synthesizer systems that require a fast settling time. The dilemma to the circuit designer is that fast settling requires wide bandwidth in the low-pass filter, but a wide bandwidth filter does not attenuate the harmonics caused by the spike and sharp edges. So simple linear filtering of the spike is not practical in a system that requires a fast settling time.

The present invention discloses a synthesizer and phase-locked loop circuit that retains all of the advantages of using a digital phase detector while eliminating the dead-zone, gaining the ability to achieve optimally fast settling time, and allowing adjustment of the lock-in phase.

U.S. Pat. No. 3,983,498, entitled "DIGITAL PHASE LOCK LOOP," discloses a phase-locked loop circuit that generates a transition pulse for both the leading and lagging edge of the input signal. Since U.S. Pat. No. 3,983,498 uses a standard digital phase comparator, it exhibits a dead-zone which the present invention does not.

U.S. Pat. No. 4,827,225, entitled "FAST LOCKING PHASE-LOCKED LOOP UTILIZING FREQUENCY ESTIMATION," discloses a phase-locked loop that achieves fast-settling times by resetting the loop chain when a new input signal is introduced. U.S. Pat. No. 4,827,225 also exhibits a dead-zone.

SUMMARY OF THE INVENTION

It is an object of the present invention to construct a frequency synthesizer with a digital phase detector that eliminates the dead-zone associated with phase-locked loop circuits which use digital phase comparators. It is also an object of the present invention to achieve an extremely fast switching synthesizer—with phase relock within one cycle of the reference frequency, after a frequency change command. It is another object of the present invention to simultaneously single-cycle phase relock of the reference frequency achieve phase relock within two cycles of the reference frequency, after a phase offset has occurred between the two phase detector input signals. It is another object of the present invention to provide a means to adjust the relative phase between the two input signals to the phase detector, which, in turn, provides a means to adjust the phase of the output signal. It is another object of the present invention to provide the above objectives over a wide frequency range (i.e. wide variability in the divide-by-N programming that is within the feedback loop).

The above objects are illustrated by comparing the new PLL synthesizer shown in FIG. 1, with a classical synthesizer. FIG. 2 shows RCA's two classical CD4046-based synthesizer PLL circuits—the first where loop filter 2a is a simple RC integrator, and the second where loop filter 2b is an RC lead-lag network. FIG. 3 shows the timing and VCO control waveforms for both filter types along with those for the new PLL synthesizer shown in FIG. 1. The VCO control voltage waveform 55b, produced by FIG. 2 with filter 2a, produces PLL's with very slow settling. By changing the filter 2a to 2b, a lead-lag type, the VCO control voltage waveform 55c is produced. While waveform 55c produces faster settling, it clearly shows a spike with sharp edges; even after filtering. A modified phase-locked-loop synthesizer, shown in FIG. 1, is disclosed that optimally smoothes these edges, and simultaneously maintains the optimum loop gain—the loop gain needed to obtain optimal-time single cycle frequency relock. The associated VCO control voltage waveform 56a, shown in FIG. 3, illustrates that the filtered output has no sharp edges.

The basic nature of a PLL synthesizer is that the value of N is changed to control the output frequency of the synthesizer. In a classic synthesizer, the loop gain is proportional to 1/N because the gain of the divide-by-N circuit 4 is 1/N. In the new synthesizer shown in FIG. 1, the loop-filter gain is governed by the on-time of switch 12. By building a pulse generator that produces a pulse width that is modulated by the desired frequency, the loop gain can be held constant. For example, for the case where the VCO frequency is proportional to its input voltage, the pulse width, and thus switch 12's on-time, is made proportional to N. This makes the gain of the modified filter be N. Therefore, the combination of the gain of 1/N (in the divide-by-N circuit) and the gain of N (in the modified loop filter circuit) produces a loop gain that is independent of N. As a result, the new synthesizer can be adjusted for optimal-time frequency-switching performance which is maintained at all frequencies. For another example, for the case where the VCO frequency is proportional to the exponential of its input voltage, the pulse width is made fixed because the slope of the frequency to input voltage curve (i.e. the "local" gain at an operating point) changes the gain by a factor of N as the VCO input voltage changes. Given the above teachings, other combinations will also provide fixed loop gain performance.

Control of the lock-in phase and elimination of the dead-zone described earlier is provided by directly measuring the phase between the VCO and reference signals and requiring it to be a particular value, as opposed to simply forcing it to zero. This phase control is provided by network filter network 2a and switch 10 acting together as a sample-hold-reset, and differential amplifier 11a. Differential amplifier 11a produces an error voltage 60a that is the difference between the measured phase 55a and the desired phase 62. The feedback loop drives this error signal to zero. Referring to FIG. 5, elimination of the dead zone is accomplished by adjusting the lock-in phase (via phase-offset 62) to a value anywhere off of the dead zone—in other words, anywhere but plus and minus a degree or so from zero degrees.

BRIEF DESCRIPTION OF THE DRAWINGS

FIG. 4 is a timing diagram for the divide-by-M circuit 6a.

DETAILED DESCRIPTION

Figure 1:
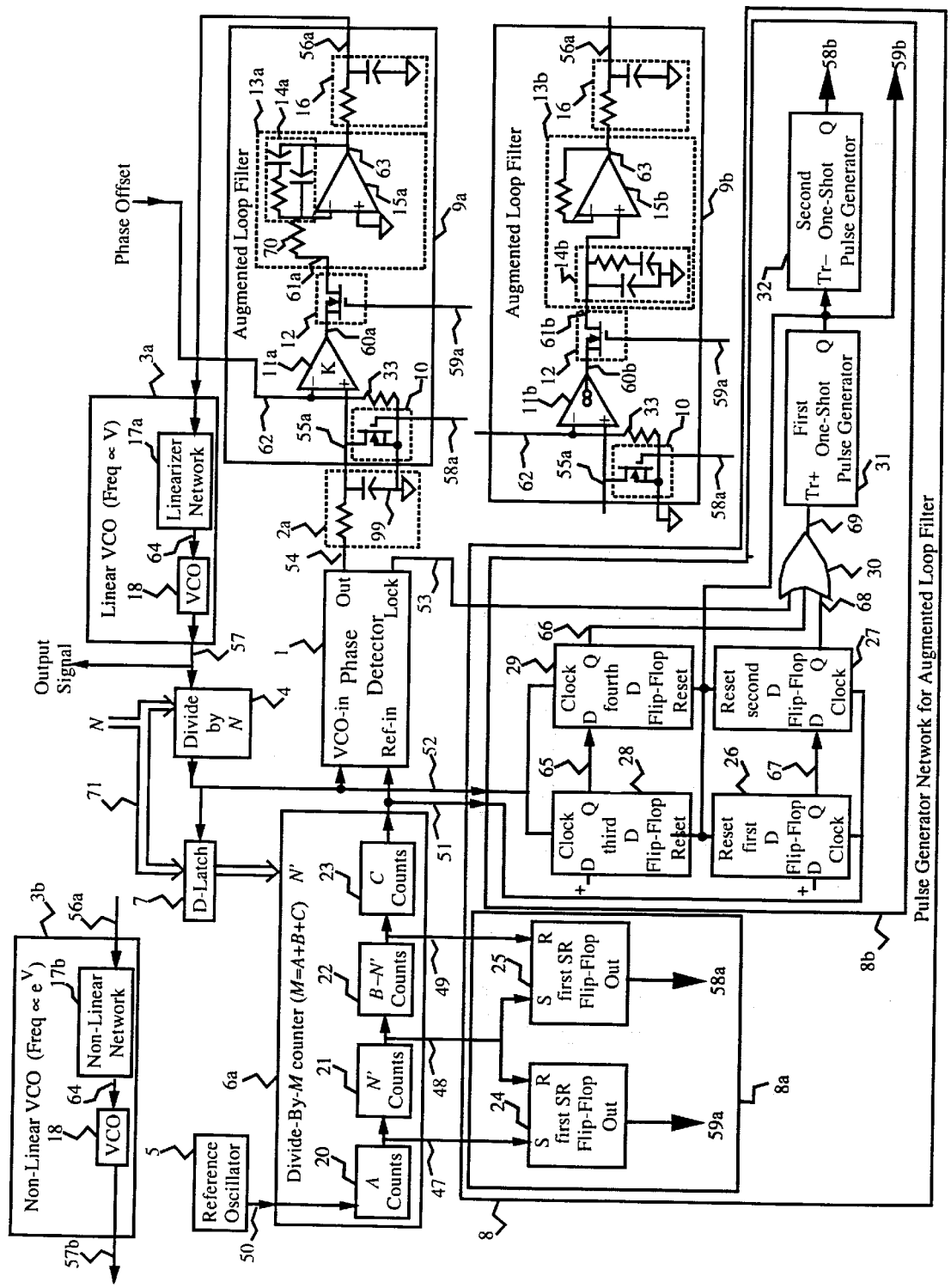
FIG. 1 is a schematic of the present invention.
Figure 2:
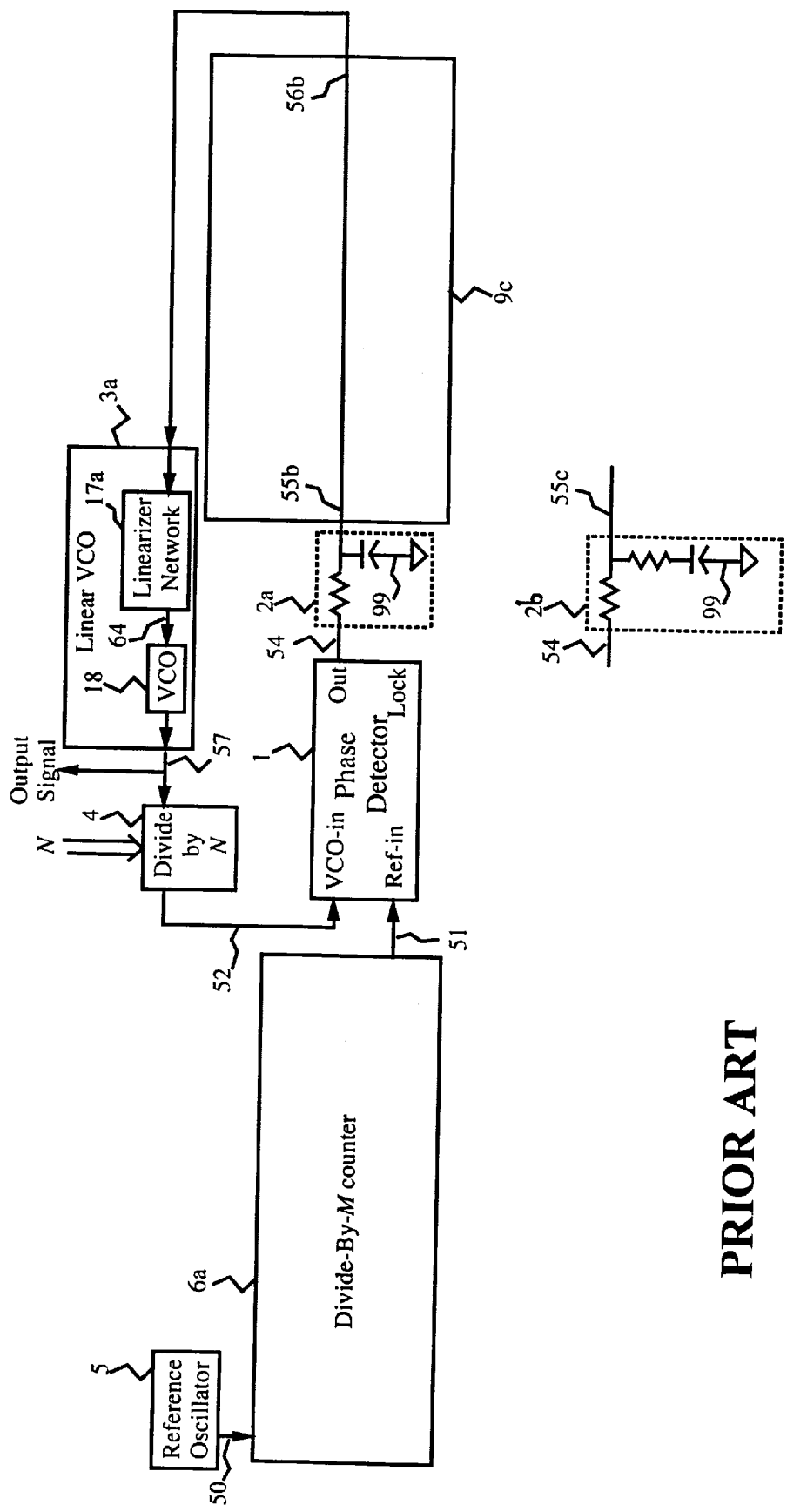
FIG. 2 is a schematic of a classic phase-locked-loop synthesizer using RCA's CD4046 and various RC filters.

A description of the new synthesizer PLL shown in FIG. 1 follows. The output 50 of reference oscillator 5 supplies the input signal to the PLL synthesizer, at a frequency of Fi. It is applied to a divide-by-M counter 6a. The first output of the divide-by-M counter, reference signal 51, is applied to the first input of a standard digital phase detector such as the CD4046. The phase detector 1 compares its two input signals and produces a first signal, 54, that indicates the difference in phase between the two signals.

The first output signal 54 of the phase detector 1 is connected to a low-pass filter 2a. The output 55a of the low pass filter 2a is applied to a nonlinear augmented loop filter, 9a or 9b, which produces a smooth control voltage 56a. A phase-offset signal 62, is also applied to the nonlinear augmented loop filter to allow the lock-in phase to be adjusted. The augmented loop filter output 56a, is applied to the control input of a linear VCO, 3a. The output 57 of linearized VCO 3a is the output of the synthesizer, which is also applied to divide-by-N counter 4. The divide-by-N counter 4 also receives the divisor N from input 71. The output 52 of the divide-by-N counter 4 is applied to the second input of-phase detector 1, thus closing the feedback loop.

The nonlinear augmented loop filter, block 9a in FIG. 1, is comprised of: a signal input 55a, a phase-offset input 62, a first switch 10; a first differential amplifier 11a with a non-inverting input, an inverting input, and an output; a second switch 12; a filter network 13a; a low-pass RC network 16, and an output signal 56a. Switches 10 and 12 can be made with any technology, such as junction or field effects transistors, photonic devices, thermionic devices etc.

The filter network 13a, is comprised of: a second differential amplifier 15a having a non-inverting input connected to ground 99, having an inverting input, and having an output connected to the output 63 of filter 13a; an RC lead-lag network 14a connected in the feedback path of differential amplifier 15a (i.e. between the inverting input and the output of differential amplifier 15a); and an input resistor 70 connecting the input of filter 13a to the inverting input of differential amplifier 15a such that filter 13a has a lead-lag transfer function.

Figure 3:
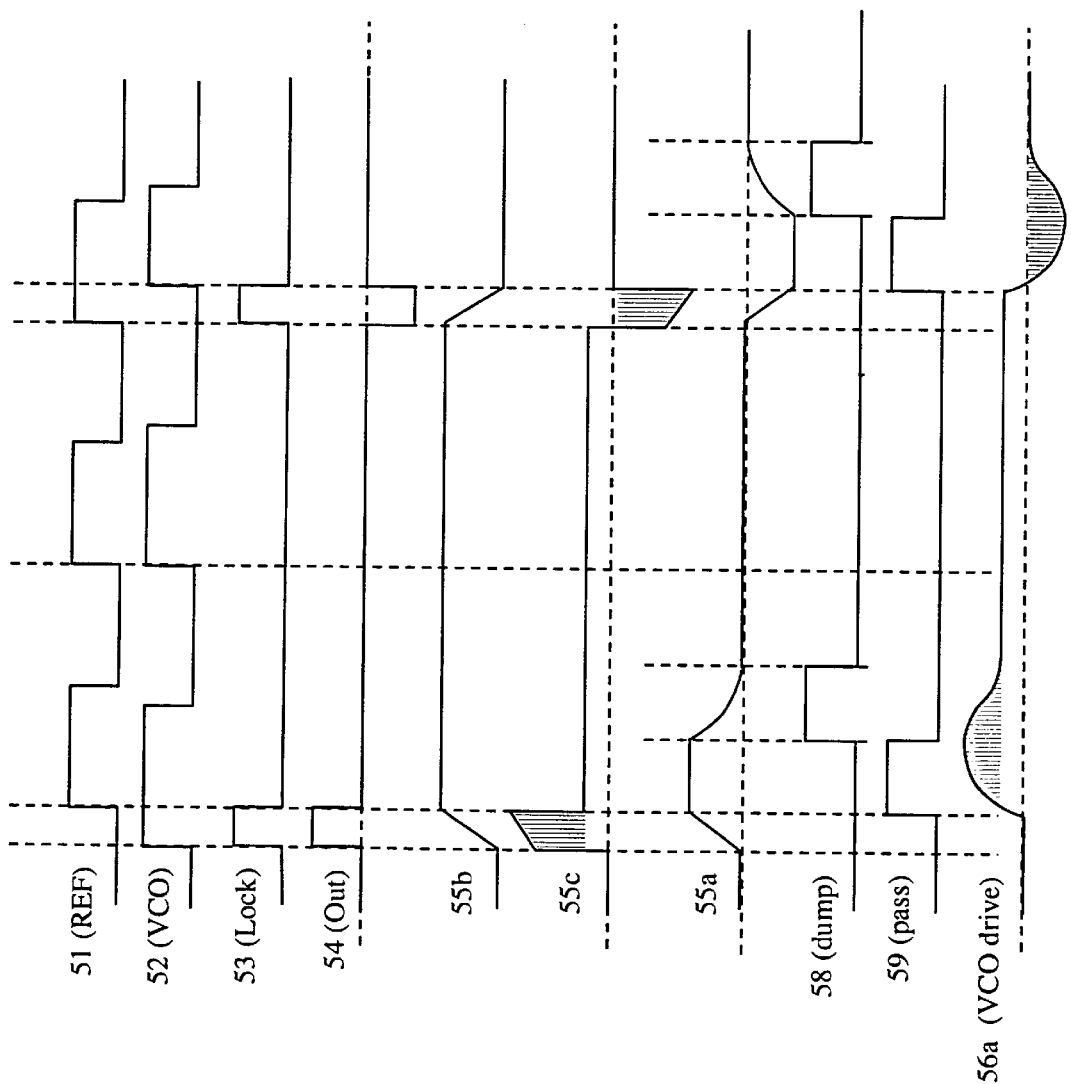
FIG. 3 is an illustration of the waveforms comparing the classic PLL synthesizer of FIG. 2, with those of the new synthesizer of FIG. 1.

The first switch 10 is connected between the output 55a of the low-pass filter 2a, and ground 99. This first switch 10 is used to discharge the low-pass filter and is controlled by 58a from the pulse generator network 8. The output 55a of the low pass network 2a is also applied to the non-inverting input of first differential amplifier 11a. The phase-offset signal 62 is connected to the inverting input of first differential amplifier 11a. The output 60a of the first differential amplifier is connected to a second switch 12. The second switch 12 connects and disconnects phase error voltage, 60a, from the filter network 13a, and is controlled by 59a from the pulse generator network 8. The filter network 13a provides an integration function that holds the VCO frequency constant unless charge is added or subtracted via the second switch 12. The output 63 of the filter network 13a is connected to a final RC low-pass filter 16, which produces the augmented loop filter output signal 56a. RC low-pass filter 16 could be bypassed, but is often mounted next to the VCO to reduce stray high frequency noise picked up on wiring. The output waveform is shaped like a broad hump as shown in FIG. 3. The broad-hump-shaped signal allows the present invention to produce a spectrally clean, low noise output signal and simultaneously achieve a settling time within one cycle of the reference signal 51. An alternative connection for the phase-offset voltage 62 is to connect it to the non-inverting input of second amplifier 15a.

An alternate embodiment of the augmented loop filter 9a, is 9b which is also shown in FIG. 1. Blocks 9a and 9b have identical transfer functions. The first differential amplifier 11a in 9a, is replaced with another differential amplifier, 11b, which has a current mode output as opposed to a voltage mode output. Such an amplifier is sometimes called a differential voltage-to-current converter. As in 9a, the non-inverting input of amplifier 11b receives the output signal 55a from the low-pass filter 2a, and the inverting input of differential amplifier 11b is connected to the phase-offset input 62. The output 60b of differential amplifier 11b is connected to the input of switch 12. The output 61b of switch 12 connects to the input of filter network 13b.

Filter network 13b could have remained identical to filter network 13a. However, with the current mode output of 11b, the RC lead-lag network 14a in 13a can be taken out of the feedback path of the second amplifier 15a, and replaced with an identical RC network 14b which, in 13b, is connected between ground 99 and the output 61b of the second switch 12 and also connecting to the non-inverting input to the second differential amplifier 15b. Connection of the RC lead-lag network 14b as shown in 13b can sometimes be used to isolate ground-loop currents in circuit construction layouts.

The first switch 10, and the high impedance input of amplifier 11a or 11b, together with the low-pass filter 2a, effectively form an integrate and hold function. The integrate and hold network provides a "pulse-width to voltage" converter function. The network converts each output pulse from the phase detector 1, into a voltage that is held until being reset by the first switch 10. The filter network 13a or 13b performs an integration function. It will hold the VCO control voltage constant if no charge is added or subtracted via the second switch 12. The amount of charge allowed to flow into the RC lead-lag network 14a or 14b is controlled by the on-time of the second switch 12, and the detected phase which is represented by the voltage on 60a or current at 60b. The time-constants for the filter 13a or 13b, together with the RC network 16, are chosen to generate a broad hump waveform on the output signal 56a, during the period of the reference signal 51, as shown in FIG. 3.

Since the divide-by-N circuit is in the feedback loop, the loop gain goes down as N goes up. In order for the loop to have optimal performance, the loop gain must stay fixed. Therefore, a means is needed to boost the loop gain as N increases. One way of controlling the loop gain is by controlling the on-time of second switch 12. By making the on-time of the second switch 12 proportional to N, the loop gain is held constant.

This on-time modulation of the second switch 12, together with the reset modulation required on the first switch 10 is accomplished with pulse generator network 8 together with the divide-by-M counter 6a, and a D-latch 7. The synthesizer multiplier number, N, is connected to both the divide-by-N circuit 4, and the D-latch 7. D-latch 7 passes N' to divide-by-M counter 6a, where N'=N/H where N/H is latched on the leading edge of the output 52 of the divide-by-N circuit 4. H is typically $2^k$ so that the division can be done by simply wiring the bits shifted by k positions.

Figure 4:
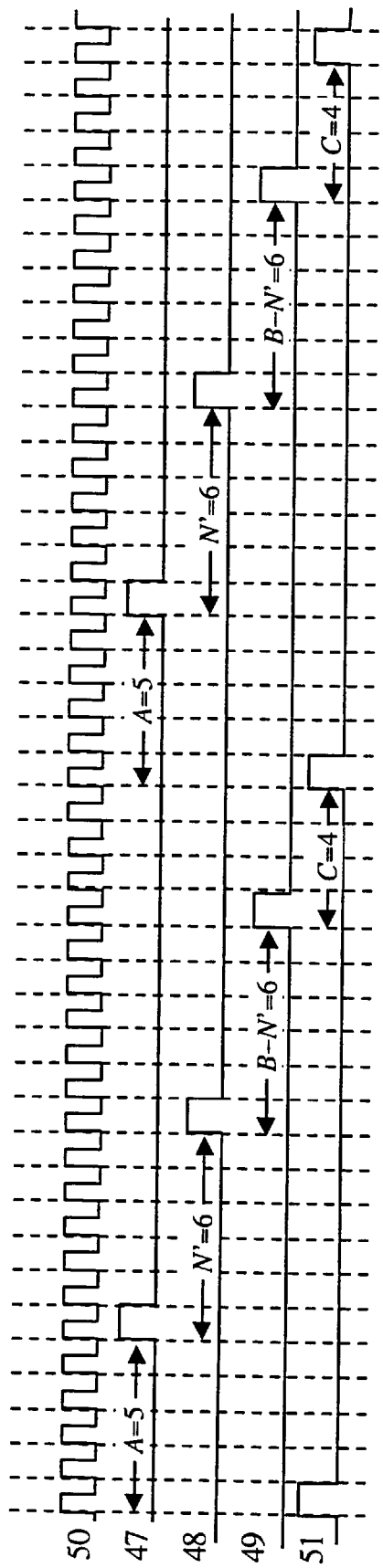
Figure 5:
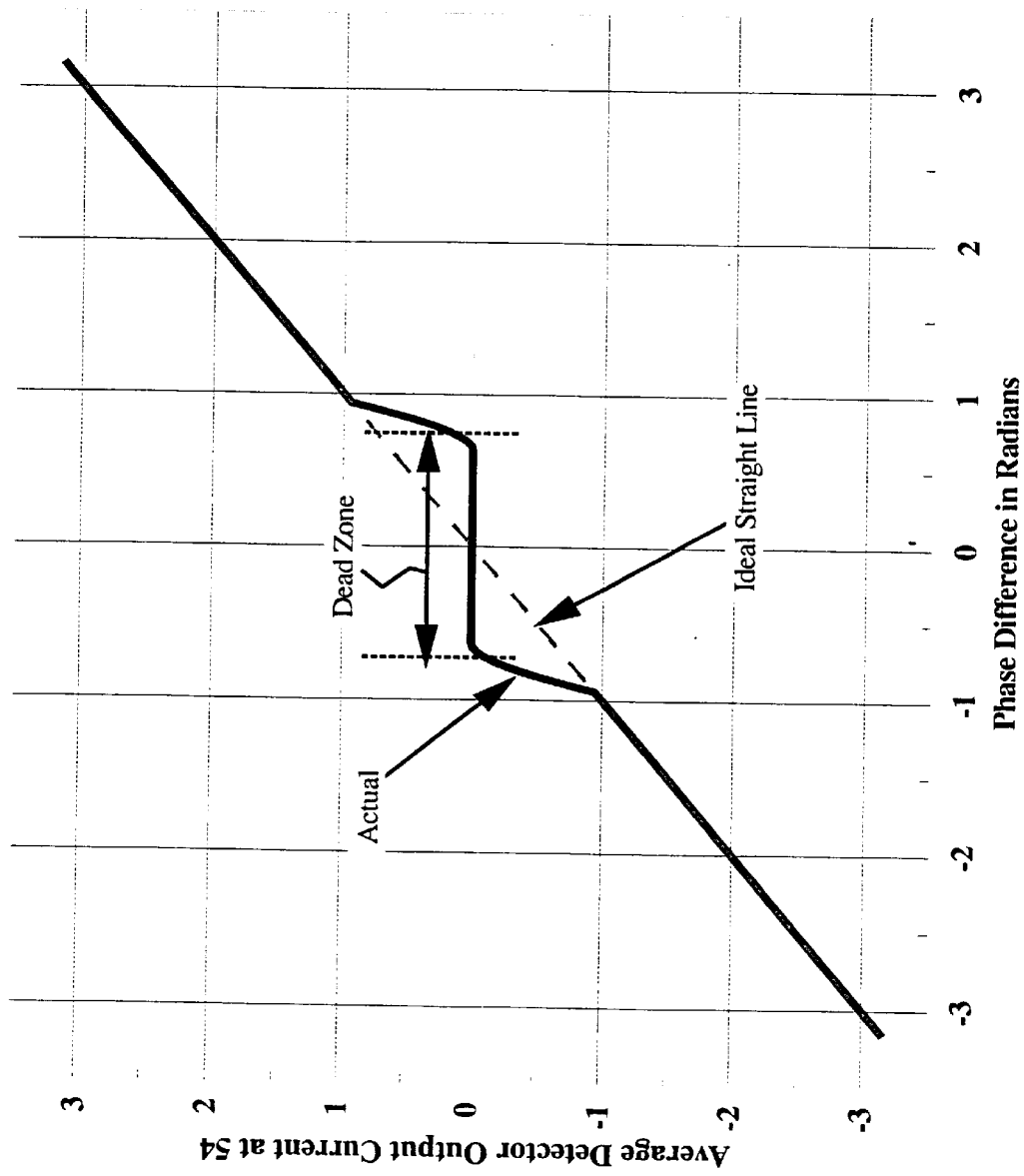
FIG. 5 is a plot of the transfer function of a standard digital phase detector, showing the dead-zone.

The divide-by-M counter circuit 6a, produces four output pulses in a sequence as shown in FIG. 4. The first output pulse 51, the reference signal, occurs C cycles after the fourth output pulse 49. The second output pulse 47, occurs A cycles after the first output pulse 51. The third output pulse 48, occurs N' cycles after the second output pulse 47. The fourth output pulse 49, occurs B-N' cycles after the third output pulse 48. These four sequential output signals drive a pulse generator network 8a, to control the first and second switches, 10 and 12.

Pulse generator network 8, shown in FIG. 1, is comprised of two sections, 8a and 8b. Section 8a is comprised of a first SR (set/reset) flip-flop 24, and a second SR flip-flop 25. Section 8b is comprised of a first D-flip-flop 26, a second D-flip-flop 27, a third D-flip-flop 28, a fourth D-flip-flop 29, a 3-input OR gate 30, a first one/shot pulse generator 31, and a second one/shot pulse generator 32.

Section 8a combines the outputs from divide-by-M counter 6a to drive the first and second switches 10 and 12. The second and third output pulses 47 and 48 from the divide-by-M circuit 6a connect respectively to the S and R inputs of a first SR flip-flop 24. The third and fourth output pulses from the divide-by-M circuit 6a connect to the S and R inputs of the second SR flip-flop respectively. The output of the second SR flip-flop 25 produces a pulse 58a that turns the first switch 10 on and off. When the pulse is high, the switch is turned on. When the pulse is low, the switch is turned off. Similarly, the output of the first SR flip-flop 24, produces a pulse 59a that turns the second switch 12, on and off.

An alternative embodiment of the fast-locking low-noise phase-locked loop is to replace linear VCO 3a with a non-linear VCO 3b and use pulse generator section 8b to drive the first and second switches 10 and 12 by connecting output 59b, instead of 59a, to second switch 12, and by connecting output 58b, instead of 58a, to first switch 10. To maintain optimally fast frequency switching when N, 71, is changed, the VCO transfer function is made non-linear with frequency proportional to the exponential of the control voltage. This non-linear function can be obtained with a non-linear reactive element in the VCO, such as a varactor diode. For wider bandwidths a network can be added to change the transfer function if necessary. This network is typically composed of diodes connected to approximate the desired non-linear curve. The exponential transfer function raises the operating-point gain when N is large (at high frequencies) and reduces the operating-point gain when N is low (at low frequencies), such that the operating-point gain is proportional to N. In other words, the overall voltage-to-frequency transfer function curve is made so that the slope of the curve is such that at any steady-state locked-in operating point, the loop gain is the same.

Referring to FIG. 1, section 8b of pulse generator network 8, is comprised of: a first 26, second 27, third 28, and fourth 29 D-flip-flop; a three input OR gate 30, a first one-shot 31, and a second one-shot 32. Reference signal 51 connects to the clock inputs of first 26 and second 27 D-flip-flops. The second input 52 of phase detector 1 connects to the clock inputs of D-flip-flops 28 and 29. The Q output 67 of first D-flip-flop 26 connects to the D input of second D-flip-flop 27. The Q output 68 of second D-flip-flop 27 connects to the first input of three-input OR gate 30. The Q output 65 of third D-flip-flop 28 connects to the D input of fourth D-flip-flop 29. The Q output 66 of fourth D-flip-flop 29 connects to the second input of three-input OR gate 30.

The lock output 53 of the phase detector 1 connects to the third input of three-input OR gate 30. The output 69 of three-input OR gate 30 connects to the plus-trigger input of first one-shot 31. The first one-shot is triggered by a low-to-high transition of its plus-trigger input 69. The output 59b of the first one-shot connects to the minus-trigger input of a second one-shot 32. The second one-shot is triggered by a high-to-low transition of its plus-trigger input 59b. The output 58b of the second one-shot 32 controls the first switch 10. The output 59b of the first one-shot also connects to the reset inputs of D-flip-flops 26, 27, 28, and 29. While the loop is locked, the second output 53 of the phase detector 1 toggles once per reference cycle, which in turn causes the first and second pulse generators 31 and 32 to fire, which in turn keeps the loop closed via switch 12 thus allowing the PLL to track properly. If switch 12 were never closed, then the loop would be open-circuited and the PLL would malfunction. The network of D-flip-flops 26, 27, 28, and 29 together with or-gate 30 guarantee that switches 10 and 12 are driven in the event that the lock signal 53 never toggles. It is possible for 53 to fail to toggle when the frequency is wrong or when the phase is within the dead-zone.

It will be appreciated that the embodiments described above and illustrated in the drawings represent only a few of the many ways of implementing a low-noise fast-locking frequency synthesizer. For example, the pulse-width modulating pulse generator could be made with analog or mixed-mode parts rather than digitally counting. Also, filter network 16 could be removed or additional filtering could be applied.

From the foregoing description it will be appreciated that the invention makes available a novel method and apparatus for a frequency synthesizer with single-cycle relock upon a frequency change command, adjustable phase, and elimination of the dead-zone inherent in digital phase detectors.

Having described preferred embodiments of a new and improved method and apparatus for a frequency synthesizer, it is believed that other modifications, variations and changes will be suggested to those skilled in the art and in view of the teachings set forth herein. It is therefore to be understood that all such variations, modifications and changes are believed to fall within the scope of the present invention as defined by the appended claims.

What is claimed is:

1. A phase-locked loop device for generating an output signal in phase-lock with a input signal, at a frequency of (N/M) times the frequency of the input signal, with adjustable lock-in phase comprising:

a) a signal input to receive an input signal of frequency Fi;

b) a programming input that receives an input number N, used to control the output frequency Fo such that Fo=(N/M)Fi;

c) a D-Latch having a clock input, having an input connected to said programming input N, and having an output N' proportional to N;

d) a phase-offset input to receive an input voltage proportional to the desired phase shift between a reference signal and a divided-down voltage controlled oscillator signal;

e) a divide-by-M means having an input connected to said signal input, having a first output also called said reference signal, wherein the output has a frequency of Fi/M;

f) a digital phase detector, having a first input connected to the output of said divide-by-M means, having a second input, having an output, and having a lock output;

g) a pulse generating means having a first output, and having a second output, wherein the pulse from said first output occurs after said output of said phase-detector returns to an open circuit state, and wherein the pulse from said second output begins after the end of the pulse from said first output, and ends before said output of said phase-detector leaves the open state, and wherein the width of the pulse from the first output is modulated in accordance with N' and the linearity of the VCO to keep the loop gain constant;

h) a first RC low-pass filter, having an input connected to the output of said digital phase detector, and having an output;

i) a first switch connected in parallel with said first RC low-pass filter so as to discharge the filter, having a control input connected to said second output of said pulse generator;

j) a first differential amplifier, having a first input connected to the output of said low-pass filter, having a second input connected to said phase-offset input signal, and having an output;

k) a second switch having an input connected to said first differential amplifier, having a control input connected to said first output of said pulse generating means, and having an output;

i) a filter having an input connected to said output of said second switch, and an output;

m) a second RC low-pass filter, having an input connected to the output of said filter, and having an output;

n) a voltage-controlled oscillator (VCO), having an input connected to the output of said second RC low-pass filter, and having an output; and o) an output signal line connected to said output of said voltage-controlled oscillator;

p) a divide-by-N means, having an input connected to the output of said voltage-controlled oscillator, having a second input connected to said programming input to receive N, and having an output connected to the said second input of said digital phase detector and connected to said input of said D-latch, wherein the frequency of said output is (1/N) times the frequency of the signal on said input.

2. The device of claim 1 wherein:

a) said pulse generating means comprises a means wherein the pulse from said first output has a width that is proportional to N' which occurs after said output of said phase-detector returns to the open state, and wherein the pulse from said second output begins after the end of the pulse from said first output, and ends before said output of said phase-detector leaves the open state; and b) said voltage-controlled oscillator has an output frequency that is proportional to it's input voltage.

3. The device of claim 2, wherein:

a) said divide-by-M means also has a second output occurring A counts after it's first output, wherein a count comprises one cycle of said signal input, and has a third output occurring N' counts after said second output, and has a fourth output occurring B-N' counts after said third output, with said first output occurring C counts after said fourth output, wherein A+B+C=M such that all outputs have a frequency of Fi/M, and is comprised of:

i) a first counting one-shot having, said second output, having a clock input connected to said signal input, having a trigger input, and having a count input programmed to count A leading-edge clock transitions between said trigger and said second output, and ii) a second counting one-shot, having said third output, having a clock input connected to said signal input, having a trigger input connected to said output of said first counting one-shot, and having a count input programmed to count N' leading-edge clock transitions between said trigger and said third output, and iii) a third counting one-shot, having said fourth output, having a clock input connected to said signal input, having a trigger input connected to said output of said second counting one-shot, and having a count input programmed to count B-N' leading-edge clock transitions between said trigger and said fourth output, and iv) a fourth counting one-shot, having said first output, having a clock input connected to said signal input, having a trigger input connected to the output of said third counting one-shot, and having a count input programmed to count C leading-edge clock transitions between said trigger and said first output; and b) said pulse generating means is comprised of:

i) a first flip-flop, having a set input connected to said second output of said divide-by-M means, having a reset input connected to said third output of said divide-by-M means, and having said first output; and ii) a second flip-flop, having a set input connected to said third output of said divide-by-M means, having a reset input connected to said fourth output of said divide-by-M means, and having said second output.

4. The device of claim 1 wherein:

a) said pulse generating means generates a pulse from said first output which has a width that is fixed and occurs after said output of said phase-detector returns to the open state, and wherein the pulse from said second output begins after the end of the pulse from said first output, and ends before said output of said phase-detector leaves the open state; and b) said voltage-controlled oscillator has an output frequency that is proportional to the exponential of the input voltage.

5. The device of claim 4, wherein said pulse generating network is comprised of:

a) a first D-flip-flop, having a clock input connected to the said reference signal, having a D input connected high, having a reset input, and having an output; and b) a second D-flip-flop, having a clock input connected to the said reference signal, having a D input connected to the said output of said first D-flip-flop, having a reset input, and having an output; and c) a third D-flip-flop, having a clock input connected to said output of said divide-by-N means, having a D input connected high, having a reset input, and having an output; and d) a fourth D-flip-flop, having a clock input connected to said output of said divide-by-N means, having a D input connected to the said output of said third D-flip-flop, having a reset input, and having an output; and e) a three-input or-gate, having a first input connected to said lock output of said digital phase detector, having a second input connected to said output of said second D-flip-flop, having a third input connected to said output of said fourth D-flip-flop and having an output; and f) a first one-shot pulse generator, having a positive-going edge sensitive trigger input connected to the output of said three-input or-gate, and having an output connected to said first output of said pulse generating network, and connected to said reset inputs on said first, second, third, and fourth D-flip-flops; and g) a second one-shot pulse generator, having a negative-going edge sensitive trigger input connected to said output of said first one-shot, and having an output connected to said second output of said pulse generating network.

6. The device of claim 1, wherein said filter is a lead-lag filter comprised of:

a) a second differential amplifier having an inverting input, having a non-inverting input connected to ground, and having an output, and b) a resistor connected between the input of said filter and the said inverting input of said second differential amplifier, and c) an RC lead-lag network connected between said output and said inverting input of said second differential amplifier.

7. The device of claim 6, wherein said first differential amplifier has a current-mode output.

8. The device of claim 1, wherein said second RC low-pass filter is bypassed.

9. The device of claim 1, wherein said first switch or said second switch is comprised of a bipolar device.

10. The device of claim 1, wherein said first switch or said second switch is comprised of a field-effect device.

11. The device of claim 1, wherein said first switch or said second switch is comprised of a thermionic device.

12. The device of claim 1, wherein said first switch or said second switch is comprised of a photonic device.

* * * * *